United States Patent [19]

Weller et al.

[11] Patent Number: 4,503,541
[45] Date of Patent: Mar. 5, 1985

[54] CONTROLLED-LINEWIDTH LASER SOURCE

[75] Inventors: Joseph F. Weller, Ft. Washington, Md.; Lew Goldberg, Alexandria, Va.

[73] Assignee: The United States of America as represented by the Secretary of the Navy, Washington, D.C.

[21] Appl. No.: 440,685

[22] Filed: Nov. 10, 1982

[51] Int. Cl.$^3$ .............................................. H01S 3/19
[52] U.S. Cl. ...................................... 372/50; 372/19; 372/26; 372/32; 372/92
[58] Field of Search ....................... 372/50, 44, 19, 26, 372/28, 29, 32, 92; 350/96.15; 332/7.51

[56] References Cited

U.S. PATENT DOCUMENTS

| | | | |
|---|---|---|---|
| 2,915,943 | 12/1959 | Brown et al. | 88/61 |
| 3,331,036 | 7/1967 | Colbow | 332/7.51 |
| 3,395,961 | 8/1968 | Ready | 350/160 |
| 3,454,771 | 7/1969 | Sterzer | 250/199 |
| 3,470,375 | 9/1969 | Chang | 250/199 |
| 3,979,694 | 9/1976 | Goldhar | 331/94.5 M |
| 3,999,146 | 12/1976 | Lang et al. | 372/50 |
| 4,093,345 | 6/1978 | Logan et al. | 350/355 |
| 4,101,845 | 7/1978 | Russer | 372/50 |
| 4,138,274 | 2/1980 | Dyment | 148/1.5 |
| 4,237,427 | 12/1980 | Holland | 331/94.5 S |

OTHER PUBLICATIONS

Tsang, Walpole, Groves and Hsieh, "Intracavity Loss Modulation of GaInAsP Lasers", SPIE, vol. 269–Integrated Optics 1981 by the Society of Photo-Optical Instrumentation Engineers; pp. 81-83.
Furuya, Miller, Coldren and Howard, "Integrated and Guided-Wave Optics", Technical Digest Post Deadline Papers, Jan. 6-8, 1982, Asilomar Conference Center, Pacific Grove, California, pp. PDP 8-1 thru 8-4.
Goldberg, Taylor, Dandridge, Weller and Miles, "Spectral Characteristics of Semiconductor Lasers With Optical Feedback", IEEE Journal of Quantum Electronics, vol. QE-18, No. 4, Apr., 1982, pp. 555-564.
Bludau et al., "Characterization of Laser-To-Fiber Coupling Techniques by Their Optical Feedback", Appl. Optics, vol. 21, No. 11, 1 Jun., 1982, pp. 1933-1939.
Figueroa et al., "Characteristics of (GaAl) As Injection Lasers Operating With an Optical Fiber External Resonator", Conference: Integrated and Guided-Wave Optics Technical Digest, Paper WD5, Incline Village, NV, USA, pp. 28-30, Jan. 1980.
Preston et al., "External Cavity Single Longitudinal Mode Laser Transmitter Module", Electronics Letters, vol. 17, No. 24, Nov. 1981, pp. 931-933.
Ebeling et al., "Generation of Single-Longitudinal-Mode... Semiconductor Lasers", Electronics Letters, vol. 18, No. 21, 14 Oct. 1982, pp. 901-902.
Reinhart et al., "Electro-Optic Frequency and Polarization Modulation Injection Laser", Appl. Phys. Lett., 36(12), 15 Jun. 1980, pp. 954-957.
Coldren et al., "Monolithic Two-Section GaInAsP-/InP Active-Optical-Resonator Devices Formed by Reactive Ion Etching", Appl. Phys. Lett., 38(5), 1 Mar. 1981, pp. 315-317.
Coldren et al., "Etched Mirror and Groove-Coupled GaInAsP/InP Laser Devices for Integrated Optics38", IEEE J. of Quantum Electronics, vol. QE-18, No. 10, Oct. 1982, pp. 1679-1688.

Primary Examiner—James W. Davie
Attorney, Agent, or Firm—Robert F. Beers; William T. Ellis

[57] ABSTRACT

Laser linewidth is controlled by reflecting a certain portion of the laser light back into the laser cavity. This control is accomplished by aligning the active layer on an electroabsorptive cell with the active layer of a semiconductor laser on a single substrate with a first waveguide therebetween. Light from the laser is guided by the first waveguide to the electroabsorptive cell whose light absorption is electronically controlled. The laser light propagates through the active region in the electroabsorptive cell and then is guided by a second waveguide to a reflection facet. The laser light is reflected by this reflection facet back through the waveguide-cell-waveguide-laser light path. The foregoing device can be formed using either a monolithic or a hybrid design.

11 Claims, 3 Drawing Figures

CONTROLLED-LINEWIDTH LASER SOURCE

BACKGROUND OF THE INVENTION

The present invention relates generally to laser diode sources, and more particularly, to controlled-linewidth laser diode sources.

Single-mode semiconductor lasers are generally used as the light sources in optical fiber transmission systems and optical fiber sensors. Accordingly, the spectral characteristics of the single-mode semiconductor lasers are important in that they set the limits on the performance capabilities of these optical fiber transmission systems and sensors. Narrow spectral linewidth and low frequency wavelength stability are particularly vital in optical heterodyne communication systems and interferometric fiber sensors having large path length differences.

One approach to line narrowing is to simply increase the output power of the laser by driving it harder with more electrical current. The linewidth has been shown to go from 100 MHz to less than 10 MHz when the output of the laser was changed from 1 mW to 10 mW. ("Fundamental Line Broadening of Single-Mode (GaAl) As Diode Lasers," Mark W. Fleming and Aran Mooradian, Applied Physics Letters, 38, (7), Apr. 1, 1981, pages 511–513). However, the problem with this approach is that the higher drive currents reduce the laser lifetime and may even destroy the laser completely. Furthermore, the reduction in linewidth using this method is not sufficient for many applications.

An alternative method is based on the fact that changes in the spectral characteristics of a single-mode laser occur when a portion of the laser output is fed back into the laser cavity. A number of investigators ("Direct Observation of Lorentzian Lineshape of Semiconductor Laser and Linewidth Reduction with External Grating Feedback," S. Saito and Y. Yamomoto, Electronic Letters, Vol. 12, No. 9, Apr. 30, 1981, pages 325–327; "Heterodyne-type Optical Fiber Communications," T. Okoshi, Proceedings of the Third International Conference on Integrated Optics and Optical Fiber Communications, paper TUB 1, pages 44–45; and "Laser Diode Emitter For Heterodyne-Type Communication Systems," F. Fabre and D. LeGuen, Proceedings of the Third International Conference on Integrated Optics and Optical Fiber Communication, paper MJ 3, page 34) have been able to narrow the spectral linewidth of a laser diode by reflecting a portion of the optical output signal back into the laser diode cavity. The reflecting element used was either a mirror, a diffraction grating, or an optical fiber. These studies have found that with no reflection or feedback into the laser cavity so that the laser operates in a free running mode, the frequency linewidth of commercially available lasers is typically 5 MHz or larger, corresponding to a wavelength linewidth of $1.0 \times 10^{-4}$ angstroms. However, in the presence of optical feedback, frequency linewidths of less than 100 kHz have been observed.

A prior art embodiment utilizing this reflection feedback technique is shown in FIG. 1. This prior art design comprises a laser diode 10 in combination with a reflecting element 20. The laser diode 10 is powered by a power supply 12 capable of providing 20–100 mA in order to inject charge carriers into the laser cavity. The laser 10 generates coherent radiation under proper biasing conditions. This coherent radiation is directed through one facet of the semiconductor laser toward the reflecting element 20. In order to control the amount of light being reflected back into the laser cavity, a neutral density filter 14 may be placed between the laser cavity 10 and the reflecting element 20. Such a neutral density filter generally comprises a glass slide covered with varying amounts of metal. By positioning the slide in the optical beam, the amount of light transmitted and consequently reflected is controlled. Because the active layer in a semiconductor laser is typically very narrow in one dimension (on the order of less than a micron), the optical output from this active layer is highly diverging. Accordingly, for most applications a collecting lens 16 is used to collimate the beam 18. Since a typical laser cavity has two mirrors or end facets, one facet may be used to provide a desired output, while the other facet may be used to provide the linewidth control reflections. Reflections of light back through the output end facet can be eliminated with a Faraday isolator, so that linewidth control can be accomplished by reflecting through only one facet of the laser.

There are a number of difficulties that arise from this prior art reflection configuration. One of the foremost difficulties is that this configuration provides no precise control over the amount of light being reflected back into the laser cavity. Additionally, mechanical alignment of the laser facets, the density filter, and the reflecting element have a significant effect on the amount of light being reflected. Thus, precision linewidth control is difficult to achieve. Furthermore, the overall size of the device is relatively large compared to a conventional laser diode.

OBJECTS OF THE INVENTION

Accordingly, it is an object of the present invention to provide precise control over the linewidth of a laser diode source.

It is a further object of the present invention to provide precise control over the optical feedback into a laser cavity.

It is yet another object of the present invention to eliminate mechanical parts in a laser diode feedback configuration such as the neutral density filter.

It is yet a further object of the present invention to provide electrically controlled optical feedback to a laser diode in order to stabilize a laser linewidth.

It is still a further object of the present invention to provide a laser diode optical feedback configuration with precise alignment between the elements therein relative to the laser cavity such that further adjustment is not required.

It is still a further object of the present invention to provide a laser optical feedback configuration capable of monolithic fabrication.

Other objects, advantages, and novel features of the present invention will become apparent from the detailed description of the invention, which follows the summary.

SUMMARY OF THE INVENTION

The above and other objects are accomplished in a controlled-linewidth laser diode source formed in accordance with the teachings of the present invention. Briefly, this controlled-linewidth laser diode source comprises, in one embodiment, a semiconductor laser diode with a laser active region having partially reflecting first and second facets at two opposing ends thereof to form a laser cavity; a laser biasing circuit for biasing the laser diode into conduction; an electroabsorption cell with an absorption active region with a third facet opposite the second laser facet; a first light path disposed between the laser diode second facet and the electroabsorption cell third facet for conducting light passing through the facets therebetween; an electroabsorption cell bias circuit for biasing the electroabsorption cell; reflecting structure for reflecting light; and a second light path disposed between the end of the electroabsorption cell opposite the third facet and the reflecting structure; wherein an output light signal is taken from the first facet and wherein linewidth variation thereof is obtained by varying the bias applied by the electroabsorption cell bias circuit on the electroabsorption cell.

In a preferred embodiment, the controlled-linewidth laser diode source may be formed on a single semiconductor substrate and the first and second light paths may be comprised of waveguides disposed on this single substrate. The reflecting structure may be simply comprised of an end facet on the second light path waveguide.

Additionally, structure may be included for adjusting the phase of the light propagating in the light path formed by the laser diode, the first light path, the electroabsorption cell, and the second light path.

The above described preferred monolithic embodiment may be fabricated utilizing the method steps of forming an active semiconductor layer on a semiconductor substrate, with the active layer having a higher index of refraction than the substrate and being thin relative to the substrate; forming a second semiconductor layer on top of the active layer, said second layer having an index of refraction less than the active layer and with a thickness greater than the active layer; processing a first portion of the second layer to obtain a laser and processing a second portion of the second layer to obtain an electroabsorptive modulator, the second portion being disposed adjacent the first portion, and with the second layer having a significant unprocessed portion; defining a first window between the first laser portion and the second modulator portion of the second layer down through the active layer and into the semiconductor substrate in such as a manner as to form a first facet in the first laser portion as one window wall and a second facet in the second modulator portion approximately opposite the first facet as a second window wall; depositing a waveguide material into the first window in order to form a first waveguide for propagating light between the first and second facets; forming a third facet edge in the laser first portion parallel with and opposite to the first facet and a given distance therefrom to define a laser cavity and forming a fourth facet approximately parallel to the second facet and a desired distance from the third facet away from the end of the modulator second portion into the unprocessed portion of the second layer; and depositing the appropriate electrodes onto the laser and the electroabsorptive modulator for driving operation.

The above described device operates as follows. When the laser is biased into stimulated emission, the light output is obtained from both facet ends of the laser. The output from one facet is coupled via the first light path into the electroabsorption cell. After propagation through this cell, the light is propagated via the second light path to a reflecting structure which acts to reflect the light back through the electroabsorptive cell and into the laser cavity itself. The amount of light fed back depends on the absorption in the electroabsorption cell which, in turn, depends on the voltage applied to the cell. Thus, electronic control may be realized over this reflection process.

DETAILED DESCRIPTION OF THE PREFERRED EMBODIMENT

Figure 1:
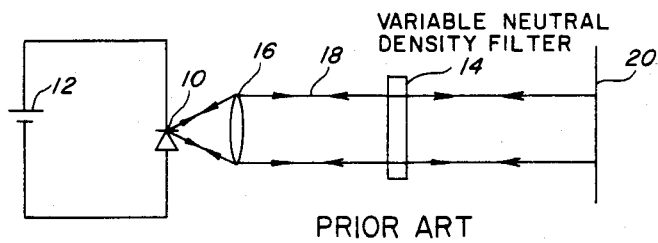
FIG. 1 shows a prior art laser diode reflection scheme.
Figure 2:
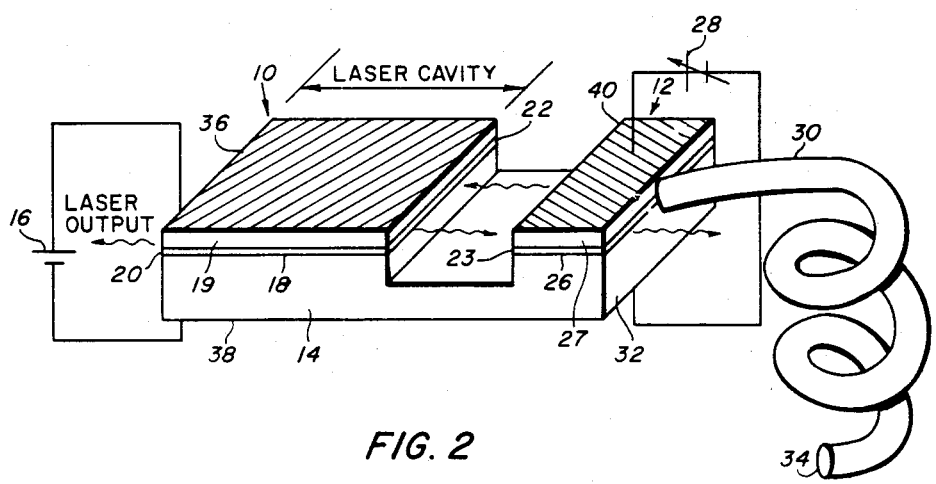
FIG. 2 is a perspective view of a hybrid configuration of the present invention.

The present invention utilizes an electroabsorption cell as part of an optical feedback system for a laser diode. The electroabsorption cell is external to the laser diode cavity and is utilized to control the amount of light being reflected back into the laser cavity. Referring now to the drawings, wherein like reference characters designate like or corresponding parts throughout the views, FIG. 2 shows a hybrid embodiment of the present invention. In FIG. 2, a laser diode 10 with an active region 18 and an electroabsorptive cell 12 with an active region 26 are shown as being fabricated on a single semiconductor substrate 14. It is to be understood, of course, that such fabrication of the laser and the electroabsorptive cell on the same substrate is not necessary for a realization of the invention in its broadest aspect. A power supply 16 capable of providing 20-100 mA is connected to inject charge carriers into the laser cavity of the laser 10. Under proper biasing conditions, stimulated emission of photons takes place in the active layer 18 in the laser diode 10.

The laser cavity for the laser 10 is formed by two end facets 20 and 22 which are partially reflecting and partially transmissive. The electroabsorptive cell 12 has a third end facet 23 formed on the wall thereof closest to the laser diode end facet 22. In the hybrid embodiment shown in FIG. 2, a fourth end facet 32 is formed opposite to the end facet 23. This facet is not used in other embodiments of this device.

By way of example, and not by way of limitation, the substrate 14 may be a (100) oriented n+InP doped to $2 \times 10^{18}$ cm$^{-3}$ and on the order of 250 microns in thickness. The laser active region 18 may be p-GaInAsP with a donor concentration of $1 \times 10^{16}$ cm$^{-3}$ and with a thickness of 1000-3000 angstroms. A second semiconductor layer 19 of, for example, p-InP, is formed on top of the active layer 18. This second layer 19 generally has a thickness on the order of several microns. A laser processing such as zinc diffusion performed on a first portion of this second layer 19 causes the p type conductivity for the second layer 19 and the active layer 18. A typical laser cavity size between the facets 20 and 22 is 200-300 microns with a width of 10-12 microns.

The electroabsorptive cell 12 is formed by the substrate 14 of n+InP, the active layer 26 of n-GaInAsP, and a second layer 19 of p-InP. The thickness for these layers may be the same as for the laser 10. However, the cell 12 is subjected to electroabsorptive type processing such as, for example, the selective implantation of Be ions into a second portion of second layer 19. Typical dimensions for such an absorptive cell are 50-75 microns between the end facets 23 and 32 and with a width of 25 microns.

Appropriate electrodes are formed on the laser and electroabsorptive cell for driving purposes. For example, electrodes 36 and 40 of Au-Zn may be plated to the top processed portions of the laser and electroabsorptive cell, respectively. Likewise, a bottom electrode 38 of Au-Sn may be plated to the bottom of substrate 14.

Light transmitted through the facet 22 from the active layer 18 of the laser propagates through a first light path 24 and through the end facet 23 to the active layer 26 of the electroabsorptive cell 12. A variable power source 28 is connected to the electroabsorptive cell 12 in order to control the photon absorption therein. This variable power source 28 may take a variety of forms. A typical bias for such a modulator is a reverse bias on the order of 20 volts or less.

The electroabsorptive cell 12 acts to absorb photons propagating therethrough from the laser 10 and thus to attenuate the laser photon beam. A second light path 30 is connected to the end facet 32 of the electroabsorptive cell. Light coupled into this second light path 30 propagates therethrough, and then is reflected at the end of the light path by a reflecting structure 34. In the embodiment shown in FIG. 2, the second light path comprises a wound optical fiber. The reflecting structure 34 simply comprises the facet on the end of the optical fiber 30. It is understood, of course, that this second light path 30 could be implemented in a variety of other configurations. For example, the second light path 30 could comprise simply an air space and the reflecting structure 34 could comprise a mirror or a diffraction grating disposed parallel to and opposite the end of the active region 26 of the electroabsorptive cell 12. However, such a configuration would have alignment problems and also would require a relatively long length for the second optical path 30.

In operation, the laser power supply 16 injects charge carriers via wire leads to the top electrode 36 on the laser and bottom substrate electrode 38. Photon emission will begin to occur at a level proportional to the carrier injection. The photon light from such an emission will be reflected back and forth between the end facets 20 and 22 for the laser cavity 10. When the optical gain for the laser equals the losses (mirror losses and material losses via scattering, band-to-band absorption, traps, etc.) then the stimulated emission grows and the device lases. Since the facet 22 is partially transmitting, a portion of the lasing beam will be applied across the first light path 24 toward the electroabsorptive cell 12. However, because the active region 18 emitting the laser beam is narrow in one dimension, the beam actually emitted is highly diverging due to diffraction effects (the half angle spread is approximately equal to the wavelength/aperture). Due to this diffraction effect, it is generally desired to make this second light path 24 as short as possible to prevent losses due to beam spreading before the beam reaches the active layer 26 of the cell 12. In this regard, it should be noted that the window for this second light path can be milled to a dimension on the order of a micron, thereby minimizing such light coupling losses. However, this problem with diffraction losses may be obviated to a great extent by depositing a cladded waveguide in the first light path 24.

A portion of the laser light coupled by the first light path 24 into the active region 26 of the electroabsorptive cell 12 is absorbed in accordance with the electric field generated across the cell by the variable power source 28. This electric field is applied via wire leads connected to the top electrode 40 on the cell and the substrate electrode 38. In essence, the electroabsorptive cell 12 operates by means of the Franz-Keldysh effect, which is observed in certain semiconductors. In particular, in direct bandgap semiconductors such as GaAs and InP, the optical absorption coefficient for the absorptive edge in an absorption versus wavelength graph shifts with the application of an electric field. Thus, there is an increase in optical absorption with electric field for photon energies slightly below the energy bandgap of the semiconductor. In essence, the Franz-Keldysh effect states that in the presence of an electric field, there is a greater probability of finding an electron at a given energy inside the energy gap between the valence band and the conduction band so that the tunneling probability for the material is increased. Accordingly, photons of lower energy than the bandgap will be sufficient to cause the electrons in the electrically biased material to jump up to the next higher band. Additionally, the propagation of a photon into the material reduces the initial energy barrier height so that tunneling becomes more probable. Thus, a shift in the absorption edge to longer wavelengths of lower energy is observed. It has recently been reported that electric fields of magnitudes larger than $3.6 \times 10^5$ V/cm can change the absorption coefficient of the material from 20 cm$^{-1}$ to 1000 cm$^{-1}$ for photon energies as much as 60 meV below the energy gap. (See "Intra-cavity Loss Modulation of GaInAsP Diode Lasers," D. Z. Tsang, J. N. Walpole, S. H. Gorves, J. J. Shieh, and J. P. Donnelly, Applied Physics Letters, Vol. 38, No. 3, Feb. 1, 1981, pages 120–122.) Thus, it can be seen that by using this large optical absorption dependence on the electrical field, an electrically variable optical loss can be produced in the above-described laser source configuration.

Accordingly, it can be seen that as the laser light propagates through the active region 26 of the electroabsorptive cell 12, a certain number of photons in the laser beam will be absorbed thereby attenuating the beam. A portion of the light propagating through the active layer 26 and exiting through the end facet 32 is coupled into the second optical path 30, which in FIG. 2, comprises the optical fiber coil. Typically, this optical fiber coil may be simply butt-coupled to the laser active region. Although this method of coupling between the active region and the optical fiber is very inefficient, it has been found, as will be discussed later, that only a small amount of optical feedback is necessary to control the laser linewidth.

The laser light propagates in the optical fiber 30 until it reaches the end facet 34 thereof. The end facet 34 reflects the laser light back through the optical fiber second light path 30, through the active region 26 of the cell 12, through the first optical path 24, and into the active region 18 of the laser cavity 10.

The first light path 24, which comprises an air gap in FIG. 2, is required in order to electrically isolate the laser amplifier section 10 from the electroabsorptive modulator cell 12 and also to confine the optical beam in the active region of both the laser diode amplifier and the electroabsorptive cell. When an air gap is utilized as the first light path, then the active regions 18 and 26 for the laser and the electroabsorptive cell, respectively, should be in lateral alignment, i.e., at the same level, for adequate light coupling therebetween.

The laser light fed back into the laser 10 acts to control the linewidth. This action can be understood by noting that the laser forms a Fabry-Perot cavity with a gain material inside it. In essence, the optical feedback increases the finesse or frequency selectivity of the Fabry-Perot cavity. The theoretical results from this linewidth narrowing feedback operation are set forth in detail in the paper "Spectral Characteristics of Semiconductor Lasers with Optical Feedback" by L. Goldberg, H. F. Taylor, A. Dandridge, J. F. Weller and R. O. Miles, I.E.E.E Journal of Quantum Electronics, Vol. QE-18, No. 4, April 1982, pages 555–564. In particular, at page 558, equation 19, the theoretical spectral width half maximum power points $\Delta \lambda_{\frac{1}{2}}$ is given by $$\Delta \lambda_{\frac{1}{2}} = \Delta \lambda_0 / (1 + \gamma)^2$$

where $\Delta \lambda 0$ is the linewidth for no feedback and $\gamma$ is defined as $$\gamma = \frac{(l + R_1) \sqrt{r} \, (Ln_1)}{\sqrt{R_1} \, (nl)}$$

where $R_1$ is the reflectivity of the end facet 22 of the laser cavity, r is the reflectivity of the reflecting structure 34, L is the path length from the end facet 22 to the reflecting structure 34, $n_1$ is the index of refraction of the second optical path 30, n is the index of refraction of the active region of the laser, and l is the length of the active region of the laser cavity. A detailed derivation of these equations is set forth in this paper. This paper is hereby incorporated by reference into the specification.

Figure 3:
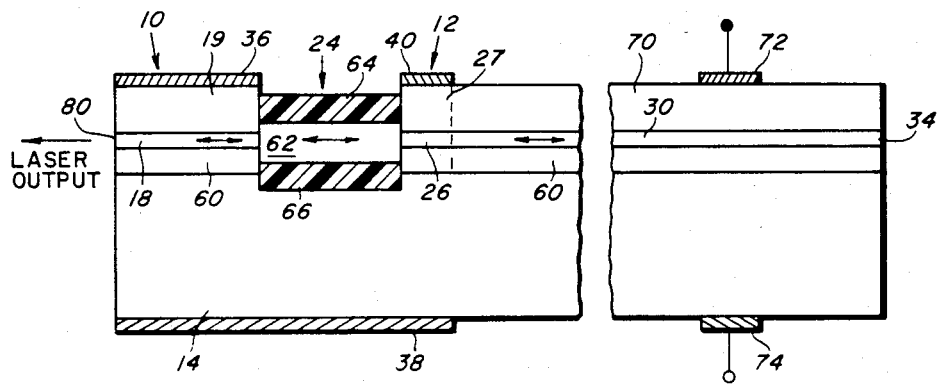
FIG. 3 is a cross-sectional view of a monolithic embodiment of the present invention.

Referring now to FIG. 3, there is shown the preferred embodiment of the present invention. This embodiment sets forth all of the elements of the embodiment of FIG. 2 in a monolithic structure. Accordingly, it is amenable to mass fabrication techniques. Referring now to the figure, a semiconductor substrate 14 again made of n+InP substrate may be utilized as the base 14. For improved operational characteristics, a buffer layer 60 may then be grown on top of the substrate 14. This buffer layer may typically be of the same material as the substrate 14. As an alternative, it could be made of n+GaAs or n+InP. It must, of course, have a lower index of refraction then the active layer to be deposited next. This buffer layer acts to isolate defects in the substrate 14 and to prevent these defects from affecting the operating characteristics of the laser and the modulator.

The laser diode 10 deposited on the substrate 14 comprises an active layer 18 of n-GaInAsP and a second layer of p-InP 19. This second layer may be laser processed with a zinc diffusion down through the active layer 18. Over this second layer the electrode 36 is formed. An electrode 38 is formed on the bottom of substrate 14 below the laser 14 and the electroabsorptive cell 12.

The electroabsorption cell 12 again comprises an active layer 26 of n-GaInAsP with a second layer 27 of Be implanted p-InP. An electrode 40 is then deposited over the second layer.

The first optical path 24 comprises a standard waveguide formed by a core layer 62 which is cladded above and below by cladding layers 64 and 66. Cladding layer 64 may simply be air. The use of a waveguide in the first optical path 24 avoids the diffraction losses due to beam spreading at the aperture of the laser active layer facet. The coupling between the laser section and the electroabsorption controller is then merely a function of matching the modes of the active layers of these devices and the waveguide.

The second light path 30 is simply formed by a continuation of the active layer 26 of the electroabsorption cell 12. Because the second layer 70 formed over the active layer 30 is not processed to form an electroabsorption cell, i.e., it is not implanted with an appropriate ion, this active layer 30 acts simply as a waveguide. The reflecting structure 34 is realized in this embodiment by the facet edge at the end of the active layer waveguide 30.

It can be seen from the previously set forth equation for the spectral width half maximum power points that one factor in determining the linewidth is 1/L. i.e., the length of the laser cavity divided by the length from the laser end facet 22 to the reflecting structure facet 34. Thus, it can be seen that it is advantageous to make the second light path waveguide 30 long relative to the laser cavity. Although the drawing in FIG. 3 is not to scale, some idea of this length differential can be seen therein.

From a review of the Goldberg, et al. article cited above and incorporated by reference into this specification, it can be seen that the narrowing of the laser linewidth depends on the round-trip phase shift in the laser cavity. A maximum line narrowing can be obtained by adjusting the length of the external cavity defined by the laser end facet 22 and the reflecting structure facet 34. Accordingly, it can be seen that it is advantageous to provide some means for adjusting the phase in this external cavity. There are a variety of techniques known in the art for achieving such phase shift control. By way of example, and not by way of limitation, a pair of electrodes 72 and 74 may be disposed on top of the second layer 70 and on the bottom of the substrate 14, respectively, for directing a current through this region to thereby effect a heating of the region. By controlling the temperature of this semiconductor region between the electrodes the length of the region can be increased or decreased in accordance with the coefficient of expansion of the region. In essence, these electrodes constitute a temperature tuning of this external cavity by means of the current heating thereof. Another technique for providing phase adjustment for this external cavity would be to place the end facet 34 of the device on a piezoelectric chip which could then be glued to the end of the active region 30. The distance of the end facet 34 could then be controlled electrically via the piezoelectric characteristics of the chip to thereby control the path length of the waveguide 30.

The device of FIG. 3 may be fabricated utilizing a number of different techniques. Additionally, it should be understood that a variety of different semiconductor materials and doping levels may be utilized to form the present device. The present invention is not limited to any one material or set of materials or doping levels thereof. A preferred method of fabricating the present device is set forth below. The materials and the doping levels of those materials and the doping levels of those materials set forth in illustrating this fabrication method are disclosed by way of example only, and not by way of limitation. This fabrication method includes the following steps:

(1) Start with a semiconductor substrate. By way of example this substrate may be a (100)-oriented InP (Sn) substrate doped to $2 \times 10^{18}$ cm$^{-3}$. The substrate may have a thickness on the order of 250 microns.

(2) Next a buffer layer may be deposited on one face of the substrate in order to isolate substrate defects. This buffer layer may be of the same material as the substrate and with the same doping level. This step is optional.

(3) Next an active layer may be formed on this buffer layer. By way of example, a layer of n-GaInAsP may be grown by liquid-phase epitaxy (LPE). The doping of this level is not critical. The thickness of the layer may vary from 1000-3000 angstroms but, again, is not critical.

(4) Form a second layer of semiconductor material over this active layer. By way of example, this second layer may be p-InP. The thickness of this layer again, is not critical. By way of example, this layer may have a thickness of several microns. It should be noted that the thickness of the active layer should be thin relative to the thickness of the substrate/buffer layer and the second layer. The reason for this relative thinness of the active layer is so that this thin active layer region will have a high current density. In essence, this thin region acts as an energy barrier thereby forming a region of recombination of carriers. This recombination action results in the generation of a larger number of photons in the region. The gain (photon generation) of this region is proportional to the current density therein. It should also be noted that this active layer region must have a higher index of refraction than the adjacent substrate/buffer layer and the second layer. These outer layers must be doped so that their indices of refraction are smaller than the active layer in order to make the active layer act as a waveguide. These outer layers then act as cladding layers therefor. The precise amount of doping of these outer layers is not critical. In fact, the second layer 19 could have a different index of refraction than the substrate or buffer layer.

(5) A first portion of this second layer is then processed to obtain a laser amplifier. A variety of processing techniques may be utilized to obtain such an amplifier. See *Semiconductor Lasers and Heterojunction LEDs*, Kressel and Butler, Academic Press 1977, Chapter 9. By way of example, zinc may be diffused through a window on the order of 10-12 microns wide in a phosphosilicate-glass (PSG) mask to form a p-n junction for the laser amplifier section. This zinc diffusion changes the conductivity type of the active layer 18 and the second layer 19 to p type. The cavity formed from this process may be, by way of example, 200-300 microns in length and 10-12 microns wide.

(6) A second portion of the second layer adjacent to the first portion may then be processed to form an electroabsorption modulator. Again, there are a variety of modulator processing techniques which may be utilized as noted in the Kressel and Butler reference cited above. By way of example, a modulator section approximately 25 microns wide and 50 microns long may be formed by selective implantation of Be ions into the InP second layer with an appropriate mask, followed by annealing at 700° C. for 10 minutes with a PSG cap layer in a flowing atmosphere of $PH_3$ and $N_2$. The length of this electroabsorptive modulator need not be great since only a small amount of photon absorption is required in order to exert substantial control over the absorption bandedge. Additionally, with a small electroabsorptive modulator, larger electric fields may be generated with the application of reasonable size voltages. By way of example, this modulator may have a length on the order of 50-75 microns with a width of 25 microns.

(7) A window is then defined between the processed first laser portion and the processed second modulator portion. The window is defined down through the second layer and the active layer and into the buffer layer and/or the substrate. Such a window may be formed utilizing photolithic-graphic techniques, i.e. one or more photoresist, masking, and etching steps. This window defining step also includes the step of forming end facet 22 on the active layer of the laser first portion and end facet 23 on the active layer of the modulator second portion. If this window is to be left as a air gap, then these facets 22 and 23 should be parallel, at the same level, and opposite to each other, in order to couple through this air gap from active region 18 to the other active region 26. However, if a waveguide is to be deposited in this window, then these facets need not be parallel since the waveguide will effect a proper coupling between the active layers. If the window is formed in this step by the process of microcleaving, ion milling, or with an orientational and material selective etching technique, then the vertical facet surfaces 22 and 23 will be formed automatically from this process. If another window forming process is utilized, then an additional facet forming step may be required. This window preferably has a length from 5-25 microns. However, it is understood that if a waveguide is utilized in this window area, then the length of this window may be longer. A dielectric film coating on the facets may be utilized to control their reflectivity.

(8) A first cladding layer 66 is then deposited in this window to a desired height somewhat below the active layers 18 and 26. By way of example, this cladding layer may be polymide and may be deposited by spin coating. Then, a layer of waveguide core material such as $SiO_2$ 62 is either sputtered or thermally evaporated on top of this first cladding layer 66. The thickness for this $SiO_2$ layer is not critical, however it should normally be thicker then the active layers 18 and 26. Finally, a second layer 64 of cladding material such as poymide may be deposited on top of the waveguide core material. The cladding layers 64 and 66 should be of sufficient thickness to avoid radiation loss to the higher index substrate 14. The $SiO_2$ core material provides a good definition layer for the facet edges 22 and 23 because this material has such a different index of refraction then those active layers.

(9) At this point, metalization for the various electrodes may be deposited on the device. In particular, a top electrode 36 may be deposited on the laser first portion of the second layer, an electrode 40 may be deposited on the modulator cell second portion of the second layer, a bottom electrode 38 may be deposited on the bottom of the substrate 14, and if phase adjustment via circuit heating is desired, then electrodes 72 and 74 may be deposited on the second layer and the substrate in the region of the second waveguide 30. By way of example, electrodes 36 and 40 may be formed by microalloying Au-Zn contacts to the Zn diffused and Be implanted laser and modulator cell regions through a PSG insulator mask layer. Electrode 38 may be formed by microalloying plated Au-Sn contacts to the substrate.

(10) At this point, a third facet 20 may be defined in the laser first portion parallel with and opposite to the other facet 22 in the laser first portion and a given distance from this facet 22. This facet 20 in conjunction with the facet 22 defines the laser cavity. The laser output is taken from the facet 20. A fourth facet (the reflecting structure 34) approximately parallel to the second facet 23 and a desired distance away from the end of the processed modulator second portion is formed in the unprocessed portion of the second layer. This end facet 34 is preferably made totally reflecting, but this is not a critical requirement. A dielectric coating on the facet may be utilized to set the reflectivity as desired. These end facets 20 and 34 may be formed simply by cleaving. The waveguide portion 30 defined by the end of the electroabsorption cell processing region and the end facet 34 may be as long desired. Typically, this waveguide portion 30 has a length on the order of 2-3 inches.

(11) Connecting wires may then be bonded to the electrodes as required.

A number of the foregoing steps such as the electrode metalization and the cleaving steps may be interchanged as desired, for the convenience of the fabrication designer.

It should be noted, that it is possible to form the device of FIG. 2 by taking a typical laser diode such as in Hitachi HLP 1400 channeled substrate planar laser or an HLP 3400 buried heterostructure laser, defining a pattern for the electrode absorption modulator cell on the laser, then removing the metalization inside this pattern, implanting the appropriate ions in this defined region in order to effect a modulator cell processing, defining a small window between the laser and the modulator portions via etching or milling, forming the facets in this window (if not already formed by the etching process), and then performing the cladding and core depositing steps for the waveguide between the laser and the modulator portions. It is possible to form the device shown in FIG. 3 from an already laser chip in a similar manner.

It should be noted that a variety of additional layers may be added to the present device. For further discussion of laser fabrication and deposition techniques for depositing the cladding and waveguide core materials, see the paper "Intergrated and Guided-Wave Optics", Jan. 6-8, 1982, Asilomar Conference Center, Pacific Grove, California, Post Deadline Paper.

The amount of laser radiation feedback into the laser cavity of the present device does not have to be large in order to obtain sufficient line narrowing. In this regard see the results set forth in the paper by Goldberg et. al., cited above. The linewidth dependence on the feedback ratio which is set out in this paper was obtained with the commerically available Hitachi HLP 1400 and HLP 3400 laser diodes noted above in combination with a feedback mirror and a variable neutral density filter. It was found that the optical feedback into the laser could be varied from $10^{-3}$ to $10^{-6}$. It is further noted in this paper that with a feedback ratio with $10^{-4}$, i.e. the amount of light reflected is 40 dB down from the laser output, the linewidth is narrowed down to a few hundred kilohertz. Thus, only a very small amount of feedback light is required to exert control over the linewidth. Accordingly, there can be a large amount of light lost in coupling from the laser cavity into the electrode absorption cell and the device will still operate with maximum effect. Thus, the embodiments of FIG. 2 and FIG. 3 are equally viable, except for certain advantages to FIG. 3 due to ease of fabrication.

It should be noted that although linewidth narrowing can be maximized by proper adjustment of phase, this phase adjustment is not a requirement for effective system operation.

It has been found that the frequency stability of the laser system is also improved by the present feedback. Such frequency variation is generally caused by index changes due to heating and carrier injection. This frequency deviation or phase noise is reduced by the factor $$\Delta V = \frac{\Delta V_o}{(l + \gamma)}$$

where $\Delta V_0$ is equal to the frequency change in the absence of feedback and $\gamma$ has been defined previously. A discussion of this frequency deviation reduction may be found at page 558 of the Goldberg et. al. reference cited above.

In general, the spectral linewidth of the dominant external cavity mode decreases with increasing feedback up to the point that the laser goes into multi mode operation. See Goldberg et. al. at page 559 and 560.

It should be noted that the length dimension for the second light path 30 can be significantly reduced by changing the index of refraction of that light path. For example, an optical fiber with a higher index of refraction need not be as long as an air gap second optical path.

It should also be noted that a Faraday isolator may be utilized as a one way light valve adjacent the output facet 20 in order to prevent light from being reflected back into the laser cavity from items external to the laser cavity. Such unwanted reflections back into the laser cavity would disrupt the electronic control over the linewidth being exerted by the modulator cell.

It can be seen from the above that the present combination of an electroabsorption cell with a laser cavity with a first optical light path therebetween and including a second optical light path from the electroabsorption cell to a reflecting structure has a variety of advantages. One major advantage is the elimination of mechanical parts such as the neutral density filter with its attendant alignment requirements. Additionally, because the electroabsorption modulator cell is electrically controlled, electrical feedback circuits may be utilized to stabilized and/or vary the linewidth very precisely. Such a feedback circuit could be easily implemented simply by including a detector to sense the light impinging on the reflecting surface 34, comparing this light to a reference for a particular linewidth via a differential amplifier, and then utilizing the output from the differential amplifier to control the electric field on the electroabsorption modulator cell.

Yet a further advantage to the present invention is that all of the design features can be fabricated on the same substrate. Accordingly, alignment of the laser relative to the modulator cell is fixed and does not require further adjustment. Furthermore, the overall size of the device need only be approximately longer then the conventional laser chip, which can be on the order of 100–300 microns long. Such compactness is a significant advantage in circuit design.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A controlled-linewidth laser diode source comprising:
   a semiconductor laser diode with a laser active region with partially reflecting first and second facets at two opposing ends thereof to form a laser cavity,
   a laser biasing circuit for biasing said laser diode into conduction;
   an electroabsorption cell with an absorption active region with a third facet on a cell wall closest to said laser diode second facet;
   a first light path disposed between said laser diode second facet and said electroabsorption cell third facet for conducting light passing through said facets therebetween;
   an electroabsorption cell bias circuit for biasing said electroabsorption cell;
   reflecting means for reflecting light; and
   a second light path disposed to conduct light from the end of said electroabsorption cell opposite to said third facet to said reflecting means;
   wherein an output light signal is taken from said first facet and wherein linewidth variation thereof is obtained by varying the bias applied by said electroabsorption cell bias circuit to said electroabsorption cell.

2. A laser diode source as defined in claim 1, wherein said first light path comprises an optical waveguide.

3. A laser diode source as defined in claim 2, wherein said second light path comprises an optical waveguide.

4. A laser diode source as defined in claim 3, wherein said second light path comprises a length of optical fiber.

5. A laser diode source as defined in claim 3, wherein said laser diode and said electroabsorption cell are disposed on a single monolithic semiconductor substrate.

6. A laser diode source as defined in claim 5, wherein said second facet of said laser diode and said third facet of said electroabsorption cell are in parallel alignment, and wherein said first light path between said second and third facets comprises an air space.

7. A laser diode source as defined in claim 6, wherein electroabsorptive cell end opposite to said third facet has a fourth facet formed thereon which is in parallel alignment with said reflecting means; and
   wherein said second light path between said fourth facet and said reflecting means comprises an air space.

8. A laser diode as defined in claim 4, further comprising means for adjusting the phase of the light propagating in the light path formed by said laser diode, said first light path, said electroabsorption cell, and said second light path.

9. A controlled-linewidth laser diode source comprising:
   a semiconductor substrate;
   a laser diode formed on said substrate, said laser diode including a laser active region with partially reflecting parallel facets at two opposing ends thereof to form a laser cavity;
   an electroabsorption cell formed on said substrate, said electroabsorption cell having an absorption active region with a third facet on the end of said cell closest to said laser second facet;
   a first light path disposed on said substrate between said laser diode second facet and said electroabsorption cell third facet for conducting light therebetween;
   a waveguide comprising a second light path formed on said substrate adjacent the end of said electroabsorption cell opposite to said third facet for conducting light passing through this end therethrough, said waveguide having a given length and with a fourth facet at the end thereof for reflecting light propagating in said second path waveguide back toward said electroabsorption cell and said laser diode; and
   appropriate contacts for applying driving currents and voltages to said laser diode and electroabsorptive cell, respectively.

10. A laser diode source as defined in claim 9, wherein said first light path comprises a waveguide formed on said substrate between said second and third facets.

11. A laser diode source as defined in claim 10, further comprising means for adjusting the phase of the light propagating in the light path formed by said laser diode, said first light path, said electroabsorption cell, and said second light path waveguide.

* * * * *